US008339188B1

(12) United States Patent
Silver et al.

(10) Patent No.: US 8,339,188 B1
(45) Date of Patent: Dec. 25, 2012

(54) FLOATING GATE REFERENCE FOR SLEEP/HIBERNATE REGULATOR

(75) Inventors: John Silver, Colorado Springs, CO (US); Harold Kutz, San Jose, CA (US); Gary Moscaluk, Colorado Springs, CO (US)

(73) Assignee: Cypress Semiconductor Corporation, San Jose, CA (US)

( * ) Notice: Subject to any disclaimer, the term of this patent is extended or adjusted under 35 U.S.C. 154(b) by 434 days.

(21) Appl. No.: 12/496,603

(22) Filed: Jul. 1, 2009

Related U.S. Application Data

(60) Provisional application No. 61/077,455, filed on Jul. 1, 2008.

(51) Int. Cl.
*G05F 1/10* (2006.01)

(52) U.S. Cl. ........ 327/538; 327/198; 327/543; 323/349; 323/351

(58) Field of Classification Search ................. 327/142, 327/143, 198, 530, 535–538, 540, 541, 543; 323/265, 268, 269, 271, 272, 282, 349–351
See application file for complete search history.

(56) References Cited

U.S. PATENT DOCUMENTS

| 5,508,956 A * | 4/1996 | Campardo et al. ........ 365/185.17 |
| 6,713,992 B2 * | 3/2004 | Matsuo et al. ................. 323/266 |
| 7,034,603 B2 * | 4/2006 | Brady et al. .................. 327/538 |
| 7,791,405 B2 * | 9/2010 | Hammerschmidt et al. .. 327/540 |
| 8,106,637 B2 * | 1/2012 | Kutz et al. ..................... 323/265 |
| 8,122,307 B1 * | 2/2012 | Lindhorst et al. ............. 714/719 |
| 2006/0132114 A1 * | 6/2006 | Giduturi et al. ............... 323/313 |

OTHER PUBLICATIONS

Low et al "Basics of Floating-Gate Low-Dropout Voltage Regulators," Proceedings of the 43rd IEEE Midwest Symposium on Circuits and Systems, 2000, vol. 3, pp. 1048-1051.*

* cited by examiner

*Primary Examiner* — Patrick O'Neill

(57) ABSTRACT

A system includes power saving circuitry to revive a system controller from a sleep mode for performance of operations in an active mode. The system also includes a regulator including a floating gate reference device to generate output voltage and current capable of powering the power saving circuitry during the sleep mode. A method includes generating a reference voltage and current with a float gate device, and powering wake-up circuitry with the reference voltage and current while in a power saving mode. The wake-up circuitry is configured to activate a main system controller from the power saving mode.

20 Claims, 9 Drawing Sheets

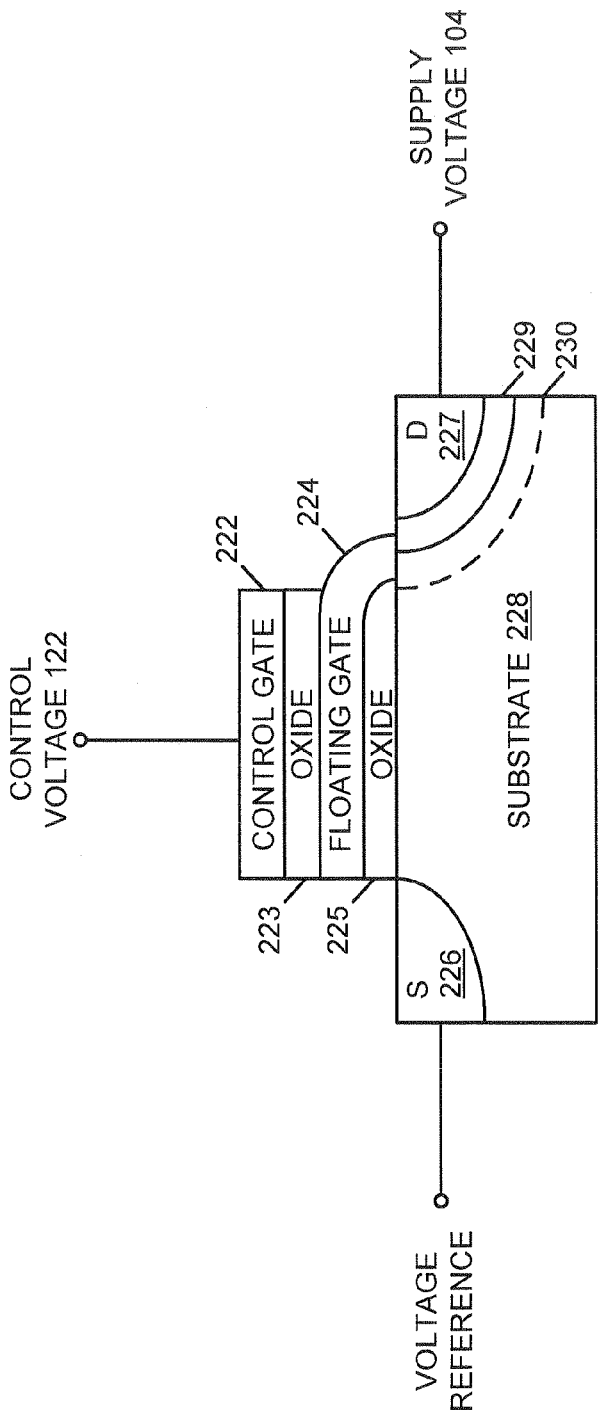

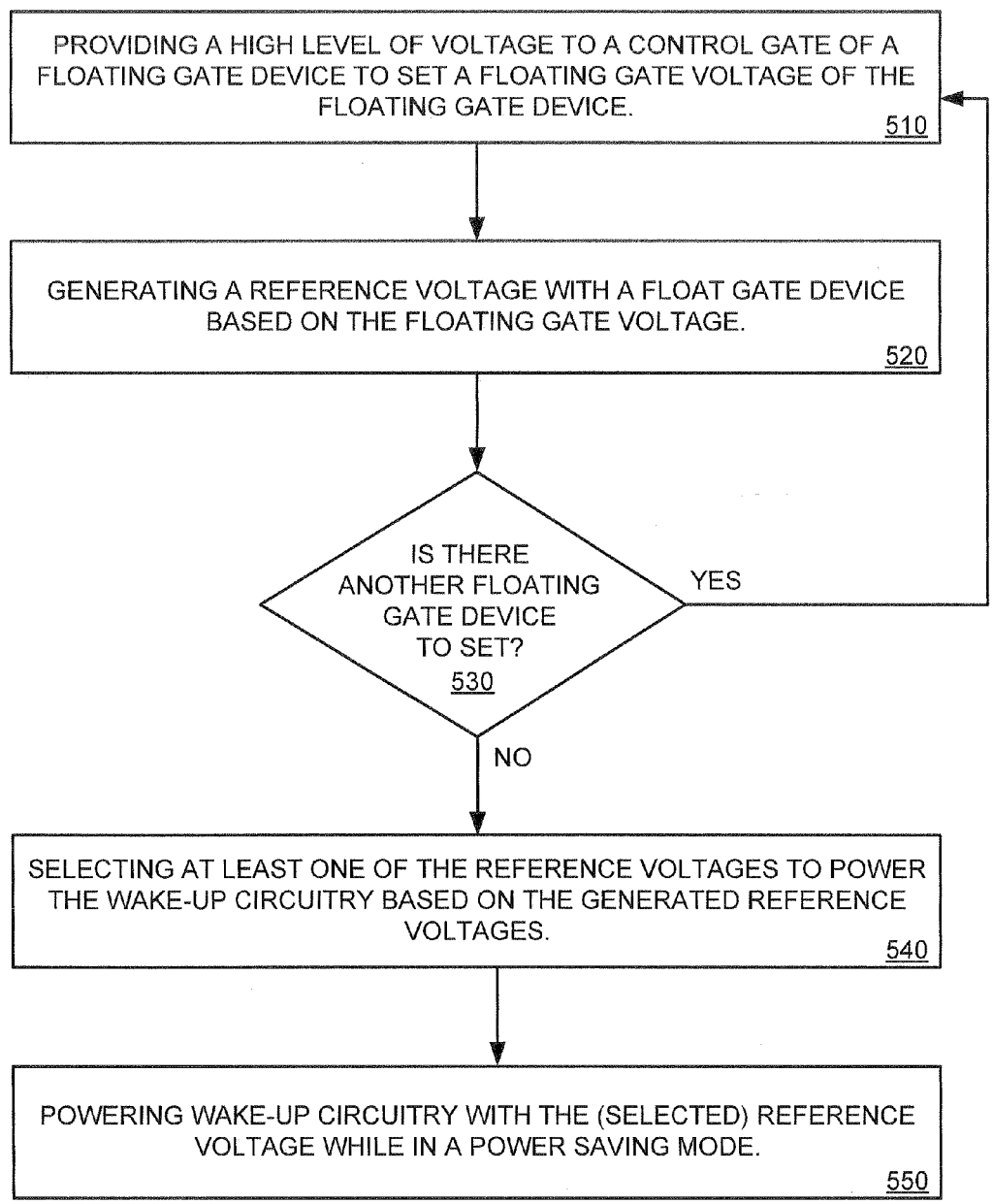

FLOATING GATE REFERENCE FOR SLEEP/HIBERNATE REGULATOR

RELATED APPLICATION

This patent application claims benefit of and priority to U.S. Provisional Patent Application No. 61/077,455, filed Jul. 1, 2008, which is incorporated by reference herein.

TECHNICAL FIELD

This disclosure relates generally to electronic circuits, and more particularly to voltage regulators.

BACKGROUND

Many electronic devices employ power conservation or power saving techniques, which can, for example, prolong battery life in portal or mobile devices. One common power saving technique is to have an electronic device enter a sleep or hibernate mode, powering down electronic components when they are not being used. These electronic devices typically include power saving circuitry to control the powering down of these components and to wake-up the electronic components when the electronic device is prompted to resume active operations.

SUMMARY

This patent application discloses a system that includes power saving circuitry to revive a system controller from a sleep mode for performance of operations in an active mode. The system also includes a regulator including a floating gate reference device to generate output voltage and current capable of powering the power saving circuitry during the sleep mode.

In some embodiments, another system includes multiple floating gate devices, each configured to generate a reference voltage according to a voltage retained on corresponding floating gates. The system can also include selection circuitry to select at least one of the floating gate devices based on voltage levels of the reference voltages.

In some embodiments, a method includes generating a reference voltage and current with a float gate device, and powering wake-up circuitry with the reference voltage and current while in a power saving mode. The wake-up circuitry is configured to activate a main system controller from the power saving mode.

DESCRIPTION OF THE DRAWINGS

FIGS. 2A-2D are cross-sectional diagrams of example floating gate reference devices shown in FIG. 1.

FIG. 5 is an example operational flowchart for the operation of the floating gate device shown in FIGS. 1, 2A-2D, 3A and 3B.

DETAILED DESCRIPTION

A programmable system on a chip (PSOC) or other electronic system can include power saving circuitry, allowing the system to enter a sleep or hibernate mode during periods of inactivity and be awakened when directed to perform operations. While in the sleep or hibernate mode, a regulator within the electronic system can supply power to the power saving circuitry, allowing the power saving circuitry, when prompted, the ability to awaken electronic components, allowing the electronic system to resume active operations. Although entering a sleep or hibernate mode can provide substantial power savings over constantly remaining in an active mode, the sleep or hibernate mode still uses that power to be supplied to both the power saving circuitry and the regulator. In some embodiments, regulators typically leak a significant amount of current, with some regulators consuming as much as 30 nA. In some embodiments, regulators can relatively large resistors, e.g. on the magnitude of 100 kΩ, which consumes significant silicon real estate.

The programmable system on a chip includes a voltage regulator to power the power saving circuitry during the sleep or hibernate mode. As discussed above, conventional regulators are often large, imprecise, and consume a relatively large amount of current while in the sleep or hibernate mode. By designing a voltage regulator with one or more floating gate devices, the programmable system on a chip can power the power saving circuitry during the sleep or hibernate mode without the drawbacks of the conventional regulators. Embodiments are shown and described below in greater detail.

Figure 1:
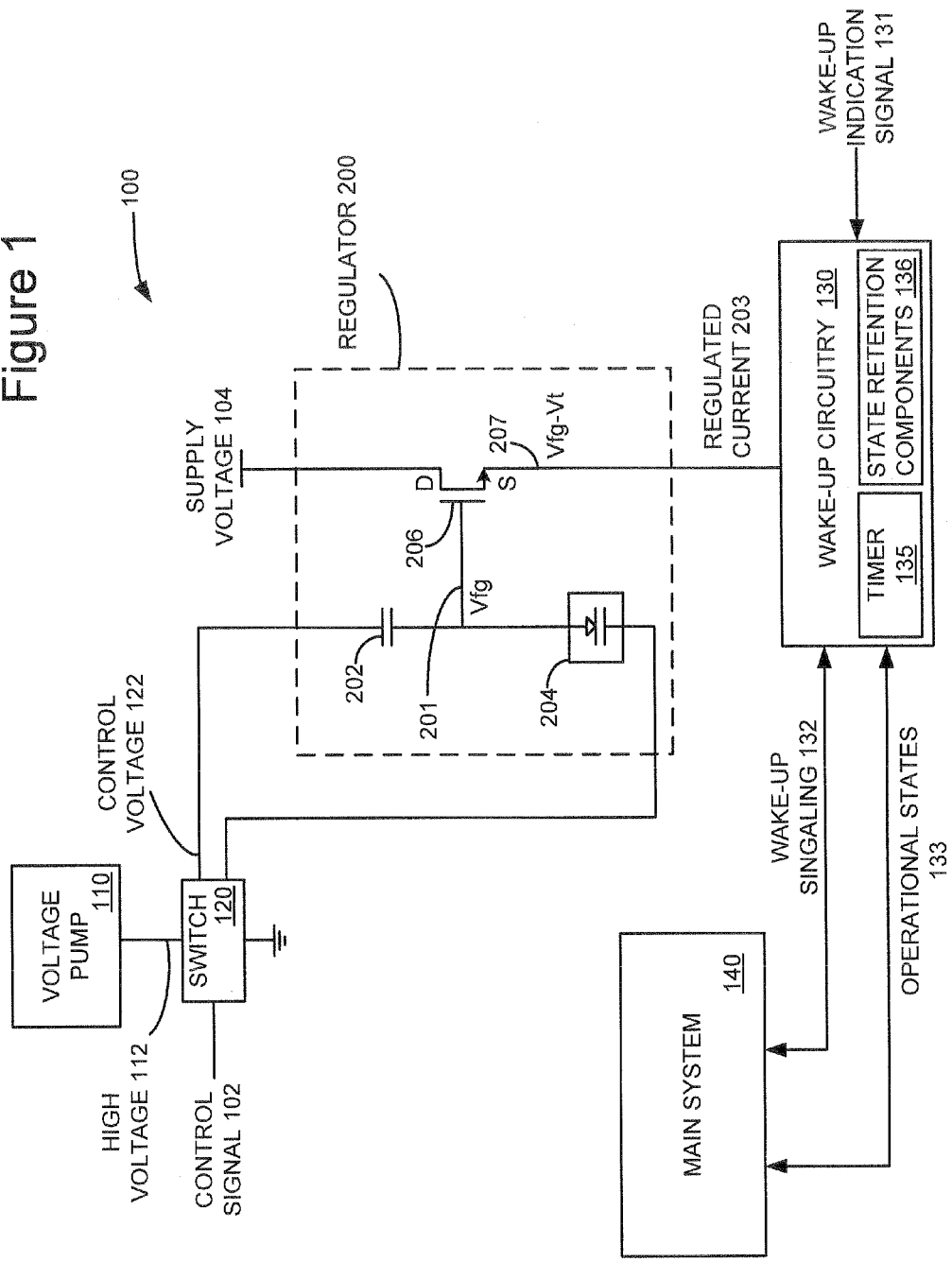
FIG. 1 is a block diagram of an example power savings system that includes a voltage regulator having a floating gate reference device according to embodiments of the invention.

FIG. 1 is a block diagram of an example programmable system on a chip (PSOC) 100 that includes a voltage regulator 200 having a floating gate reference device according to embodiments of the invention. Referring to FIG. 1, the programmable system on a chip 100 includes a main system 140 to perform various operations in an active mode. During periods of inactivity, the main system 140 can enter a sleep or hibernate mode, allowing the programmable system on a chip 100 to consume a reduced amount of power.

The programmable system on a chip 100 includes wake-up circuitry 130, also known as power saving circuitry, which can remain active during the sleep or hibernate mode and awaken the main system 140 when operations are to be performed in an active mode. In some embodiments, the wake-up circuitry 130 can send wake-up signaling 132 to the main system 140, prompting the main system 140 to transition from the sleep or hibernate mode to the active mode.

The wake-up circuitry 130 can determine to awaken the main system 140 from the sleep or hibernate mode in several ways. For instance, the wake-up circuitry 130 can receive a wake-up indication signal 131 that prompts the wake-up circuitry 130 to awaken the main system 140. In some embodiments, the wake-up circuitry 130 can include a timer 135 that, when elapsed, can prompt the wake-up circuitry 130 to awaken the main system 140 from the sleep or hibernate mode.

The wake-up circuitry 130 can also include state retention components 136 that store operational states 133 of at least a portion of the main system 140 while in a sleep or hibernate mode. The state retention components 136 can include volatile or non-volatile memory devices to store the operational states 133. The operational states 133 of the main system 140 can be sent to the wake-up circuitry 130 for storage by the state retention components 136 while the main system 140 is transitioning from an active mode to a sleep or hibernate mode. In some embodiments, the wake-up circuitry 130 can be continually, periodically, and/or intermittently updated with the operational state while the main system 140 is in the active mode, reducing the delay in transitioning between the active mode and the sleep or hibernate mode.

The programmable system on a chip 100 includes a regulator 200 to provide a voltage reference and regulated current 203 to the wake-up circuitry 130, allowing the wake-up circuitry 130 to remain operational during the sleep or hibernate mode. The regulator 200 can receive a supply voltage 104 and generate the regulated current 203 based, at least in part, on the supply voltage 104.

The regulator 200 includes a floating gate reference device to generate the voltage reference and regulated current 203 based, at least in part, on the supply voltage 104 and a retained voltage on a floating gate 201. The regulator 200, shown in FIG. 1, includes a circuit representation of the floating gate reference device. The floating gate reference device includes a floating gate 201 that, once set or programmed, can store a charge or floating gate voltage Vfg for long periods of time, i.e., in certain configurations, the floating gate voltage can lose a tenth of a milli-volt over several years.

This stored charge or floating gate voltage Vfg can be utilized to activate a transistor 206, providing a relatively constant voltage reference and a regulated current 203 from the source of the transistor. This voltage reference and regulated current 203 can be provided to the wake-up circuitry 130 for its operation. Since the floating gate voltage Vfg is substantially constant for long periods of time, the transistor 206 can remain activated during the sleep or hibernate mode without drawing current from a supply voltage 104 for its operation. The current that is drawn from the supply voltage 104 is almost exclusively provided to the wake-up circuitry 130, with minor current leakage of the transistor, for example, 0.1 nA or less, providing the primary inefficiency. Also, the floating gate reference device is physically smaller than resistors used in conventional regulators.

The programmable system on a chip 100 includes a voltage pump 110 and a switch 120, which can be utilized to program and erase the floating gate reference device to provide a regulated amount of current to the wake-up circuitry 130. The voltage pump 110 can provide a high voltage 112 to a switch 120 and the switch 120 can provide either the high voltage 112 or a ground voltage to the floating gate reference device responsive to a control signal 102, for example, from the main system 140.

When a high voltage 112 is provided to the floating gate reference device, the floating gate 201 is charged according to electrons tunneled through a tunneling capacitor 202, according to a phenomenon known as Fowler-Nordheim tunneling or hot carrier injection, and stored by another capacitor 204. This floating gate charging is time-dependent, meaning that floating gate voltage Vfg rises the longer the high voltage 112 is applied to tunneling capacitor 202. After the floating gate has reached the desired voltage level, the switch 120 can transition to providing a ground voltage to the tunneling capacitor 202, locking the voltage level on the floating gate 201.

During programming, the source and drain of floating gate device 206 can be held at the supply voltage 104 to avoid degradation of the transistor 206 during programming operations. The switch 120 can place a high voltage, for example, approximately 12V, on the tunneling capacitor 202 and can provide a ground voltage to device 204. The regulator 200 can be configured such that the capacitance of device 204 can be much greater than the capacitance of device 202, and thus a majority of the control voltage 122 will drop across the tunneling capacitor 202, allowing charge injection through the tunneling capacitor 202 to the floating gate 201. The floating gate 201 can start the process at a low voltage, for example, near a ground voltage, and thus a small percentage of the voltage drop is present for device 204 and little charge injection occurs across this device 204. Similarly, with the source and drain of the floating gate device 206 at the supply, little injection occurs here as well.

In some embodiments, the floating gate 201 can be programmed with an amount of charge to control the desired resistance in the channel connecting the source and drain of the transistor 206. The floating gate 201 can be charged until a particular resistance is reached, for example 20 kΩ, which determines an amount of current provided to the wake-up circuitry 130. Thus, the current provided by the floating gate reference device is more stable than the current provided by conventional voltage regulators using conventional resistors.

Figure 2A:
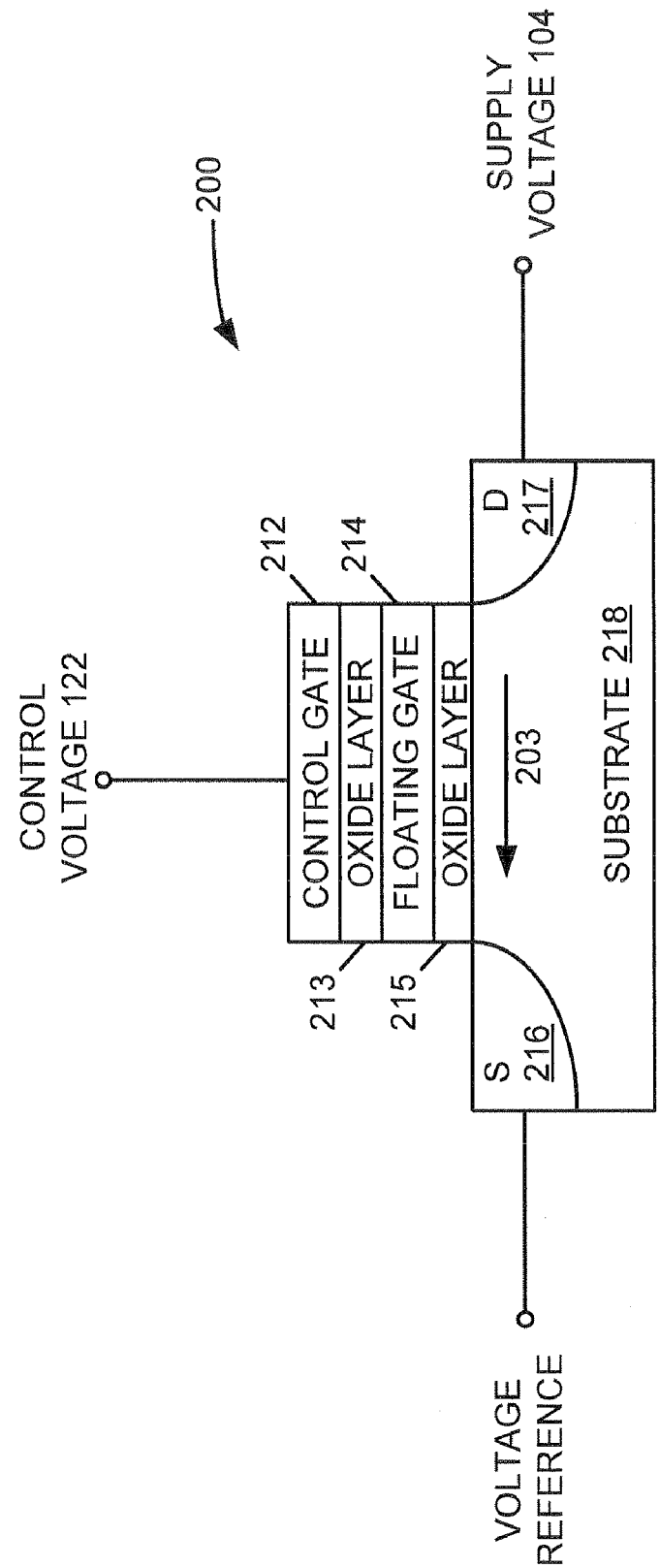
Figure 2B:
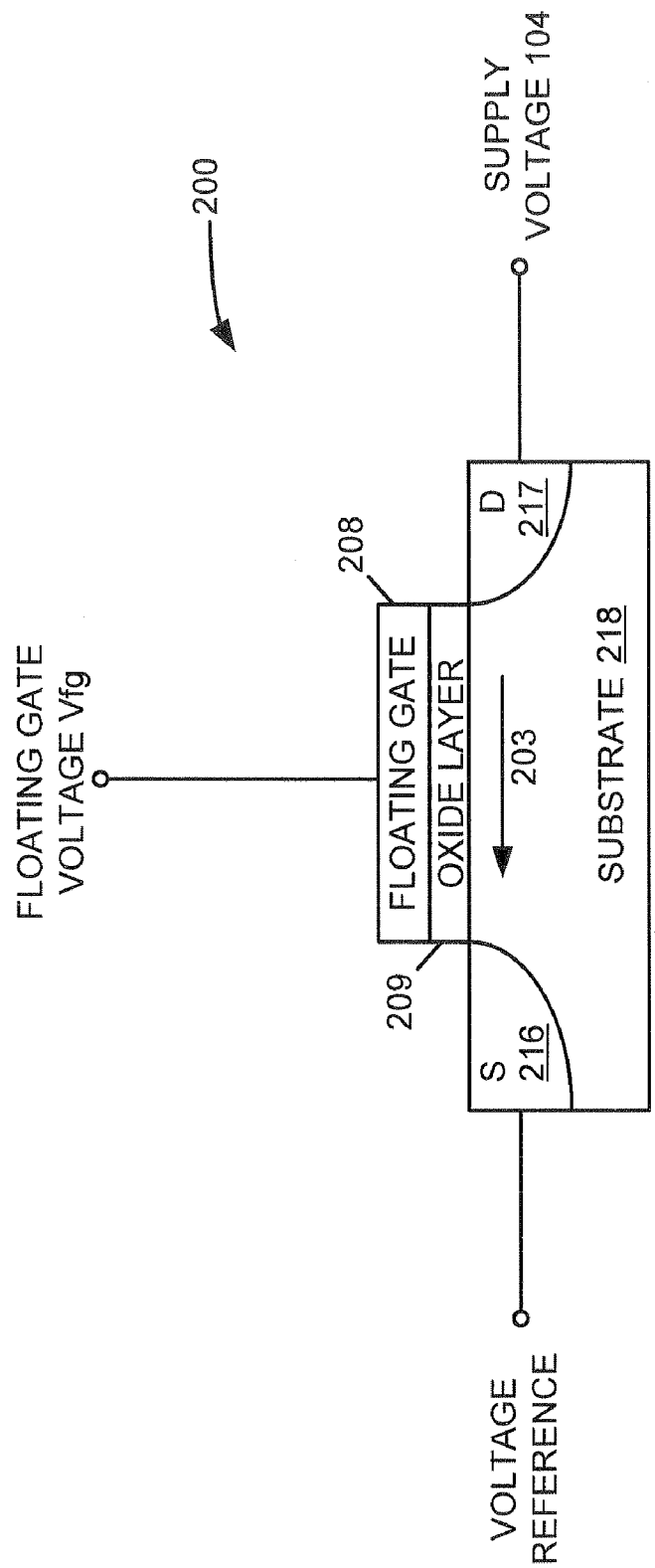
Figure 2D:
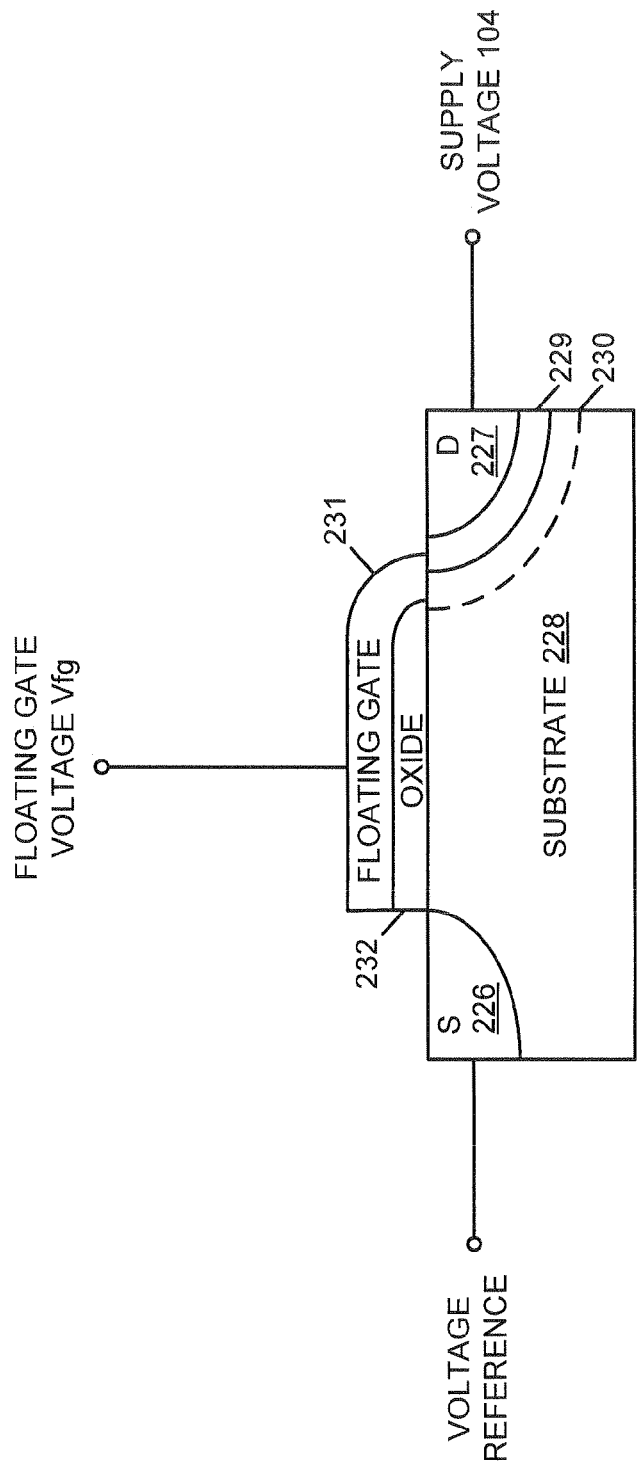

FIGS. 2A2D are cross-sectional diagrams of example floating gate reference devices shown in FIG. 1. Referring to FIG. 2A, the floating gate device 200A includes a substrate 218 having source 216 and drain 217 regions. In a gate region, in between the source 216 and drain 217 on the surface of the substrate 218, a floating gate 214 is formed over an oxide layer 215. The floating gate 214 when charged, can activate the floating gate device 200 to pass current 203 from the drain 217 to the source 216 based, at least in part, on the charge on the floating gate 214.

A control gate 212 can be formed on another oxide layer 213 located over the floating gate 214. The control gate 212 can receive a control voltage 122 that, when set to a high level, allows electrons to tunnel through the oxide layer 213, and set a charge on the floating gate 214. As discussed above, this set charge is relatively constant and can remain on the floating gate 214 substantially unchanged for years.

Referring to FIG. 2B, the floating gate device 200B is similar to the floating gate device 200A shown in FIG. 2A, with the following differences. The floating gate device 200B does not include the control gate 212 and an oxide layer 213, and instead the floating gate is coupled to capacitive components 202 and 204 shown in FIG. 1. The floating gate device 200B can be configured as a source follower and provide a reference voltage at the source 216 approximately equal to the floating gate voltage Vfg minus the threshold voltage Vt of the floating gate device 200B, or Vfg-Vt. In some embodiments, the floating gate device 200B is a "native" device with nominally zero threshold voltage, i.e., where Vt is approximately equal to zero voltage 0V). Thus, nominally, the source 216 can be set to the floating gate voltage Vfg, as Vfg−0V=Vfg To maintain the integrity of the floating gate devices 200A and 200B, in some configurations no more than one electron a day should escape from the floating gate 208 or 214, respectively. Any larger electron loss or "leakage" could cause inaccuracies in the reference voltage and prevent other circuits, such as the wake-up circuitry 130, connected to the floating gate devices 200A and 200B from operating correctly.

Referring to FIGS. 2C and 2D, the multiple extended drain floating gate devices shown in FIGS. 2C and 2D are similar to the floating gate devices 200A and 200B shown in FIGS. 2A and 2B, but have been modified to reduce leakage due to electrons traveling into an oxide layer 225 and 232, respectively. The extended drain floating gate device, as its name suggests, includes a heavier doped drain region 227 that is extended further from the gate region, with a more lightly doped than drain region 229 closer to the gate region of the extended drain floating gate device. This more lightly doped region 229 reduces the number of electrons that can tunnel into the gate oxide layer 225 or 232 and thus reduces leakage or drop in a voltage retained on the floating gate 224 or 231.

Since the drain region 227 is extended out from the oxide layer 225 or 232 and the more lightly doped region 229 is formed around the drain region 227, the voltage applied to the drain region 227 accordingly creates a larger depletion region 230. The larger depletion region 230 has a smaller field that results in less electron velocity and fewer electrons running into the oxide layer 225 or 232.

Figure 3A:
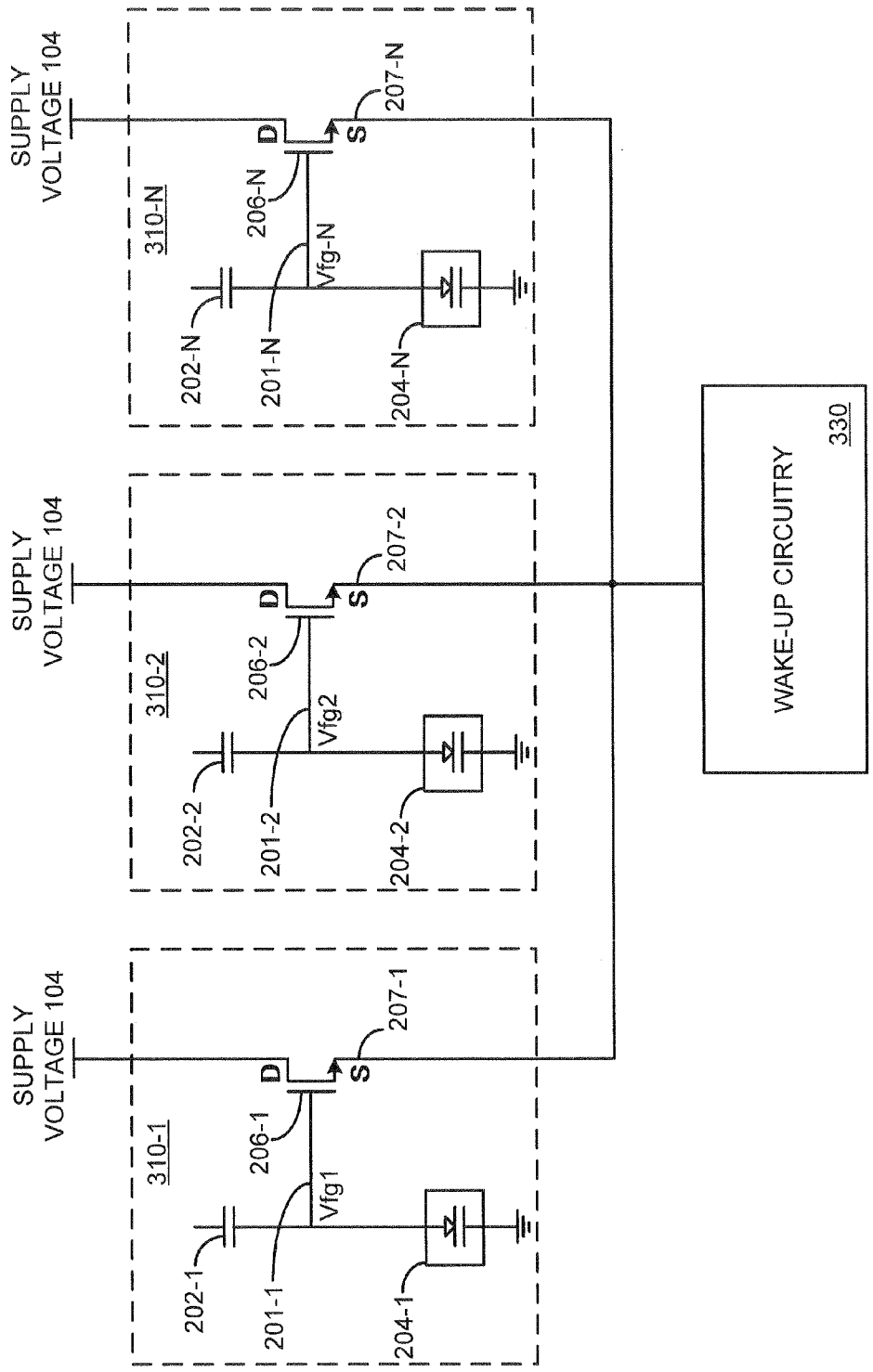
FIGS. 3A and 3B are block diagram examples of redundancy systems incorporating multiple float gate reference devices according to embodiments of the invention.
Figure 3B:
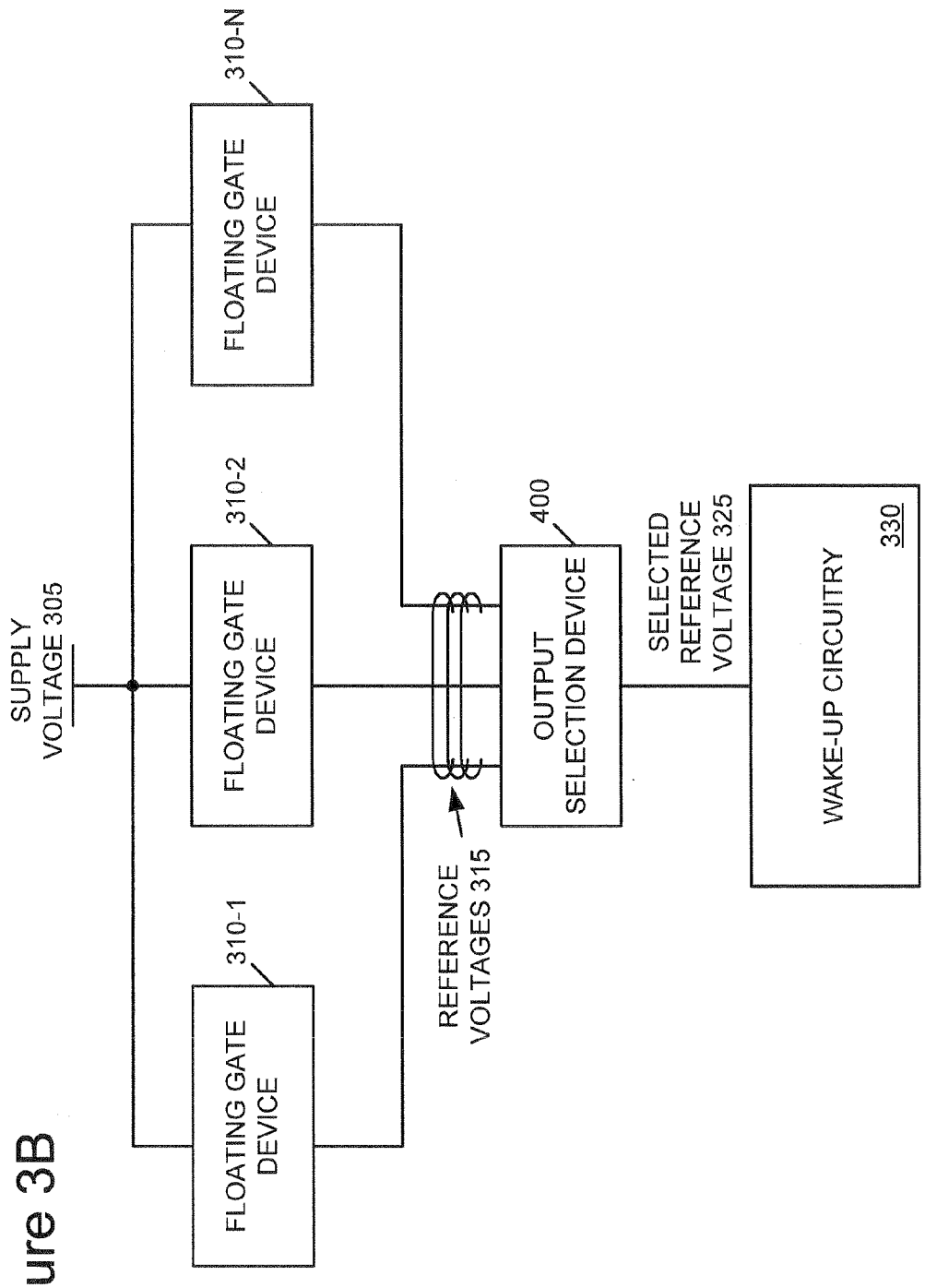

The extended drain device shown in FIG. 2D can also be configured as a source follower, similar to the floating gate device 200B shown in FIG. 2B, and provide a reference voltage at the source 226 approximately equal to the floating gate voltage Vfg minus the threshold voltage Vt of the floating gate device 200D, or Vfg-Vt. In some embodiments, the floating gate device 200D can be a "native" device with nominally zero threshold voltage, i.e., where Vt is approximately equal to zero voltage 0V). Thus, nominally, the source 226 can be set to the floating gate voltage Vfg, as Vfg-0V=Vfg FIGS. 3A and 3B are block diagram examples of a redundancy system incorporating multiple float gate reference devices according to embodiments of the invention. Referring to FIG. 3A, the redundancy system 300A includes multiple floating gate reference devices 310-1 to 310-N, each to receive a supply voltage 104 and generate a corresponding reference voltage at a source 207-1, 207-2, and 207-N. The floating gate devices 310-1 to 310-N can be similar to the floating gate devices discussed above in FIGS. 1 and 2A-2D, with each having a floating gate retaining a voltage that activates the floating gate devices 310-1 to 310-N to output the reference voltages.

Although the floating gates can retain voltages for long periods of time, it is possible that due to fabrication variations, some floating gate devices could leak floating gate charge more quickly than others. This slow leakage of charge from a floating gate slowly drops the output reference voltage, which can affect the amount of current provided to wake-up circuitry 330. To help eliminate leakage variance based on fabrication anomalies, the redundancy system 300A can include multiple instances of the floating gate devices 310-1 to 310-N that provide their corresponding reference voltages to wake-up circuitry 330 over a common node.

For each floating gate device 310-1 to 310-N, the reference voltage at source region 207-1 to 207-N is approximately equal to the floating gate voltage Vfg1-VfgN of the respectively floating gate devices 310-1 to 310-N minus the threshold voltages Vt of the transistors 206-1 to 206-N in the floating gate devices. When Vfg1, Vfg2, and VfgN all have the same voltage level, the voltage provided to the wake-up circuitry 330 will be approximately equal to that common floating gate voltage minus a threshold voltage Vt for the floating gate devices 310-1 to 310-N. When a charge is lost in at least one of the floating gates, for example, floating gate device 310-N, then the voltage at the source 207-N of the floating gate device 310-N will drop. Thus, the floating gate voltages of the other floating gate devices Vfg1 and Vfg2 will be greater that the floating gate voltage VfgN. Since the reference voltages of the floating gate devices 310-1 to 310-N are tied to a common node, the drop in the floating gate voltage VfgN causes the floating device 310-N to be turned-off and the voltage provided to the wake-up circuitry 330 to be held by the floating gate voltages Vfg1 and Vfg2.

Referring to FIG. 3B, the redundancy system 300 includes multiple floating gate reference devices 310-1 to 310-N, each to receive a supply voltage 305 and generate a corresponding reference voltage 315. The floating gate devices 310-1 to 310-N can be similar to the floating gate devices discussed above in FIGS. 1 and 2A-2D, with each having a floating gate retaining a voltage that activates the floating gate devices 310-1 to 310-N to output the reference voltages 315.

Although the floating gates can retain voltages for long periods of time, it is possible that due to fabrication variations, some floating gate devices could leak floating gate charge more quickly than others. This slow leakage of charge from a floating gate slowly drops the output reference voltage 315, which can affect the amount of current provided to wake-up circuitry 330. To help eliminate leakage variance based on fabrication anomalies, the redundancy system 300B can include multiple instances of the floating gate devices 310-1 to 310-N and include an output selection device 400 to select one of the reference voltages 315 generated by the floating gate devices 310-1 to 310-N to provide to wake-up circuitry 330.

The output selection device 400 can select at least one of the floating gate devices 310-1 to 310-N to power wake-up circuitry 330 based on the reference voltages 315 generated by the floating gate devices 310-1 to 310-N. In some embodiments, the output selection device 400 can pass through the selected reference voltage and current from the selected floating gate device 310-1 to 310-N, or the output selection device 400 physically link or connect the output of the selected floating gate device 310-1 to 310-N to the wake-up circuitry 330. The output selection device 400 can also aggregate multiple floating gate device outputs together to power the wake-up circuitry 330. This aggregation can be based on the reference voltages 315 received from the floating gate devices 310-1 to 310-N, and possibly based on change in the reference voltages 315 over time. Embodiments of the output selection device will be described below in greater detail.

Figure 4B:
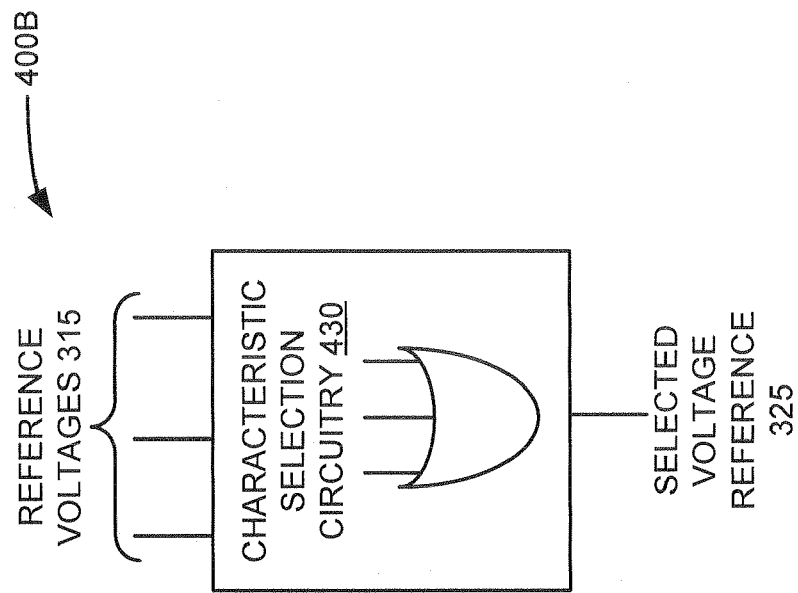
FIGS. 4A and 4B are block diagram examples of a selection device shown in FIG. 3.
Figure 4A:
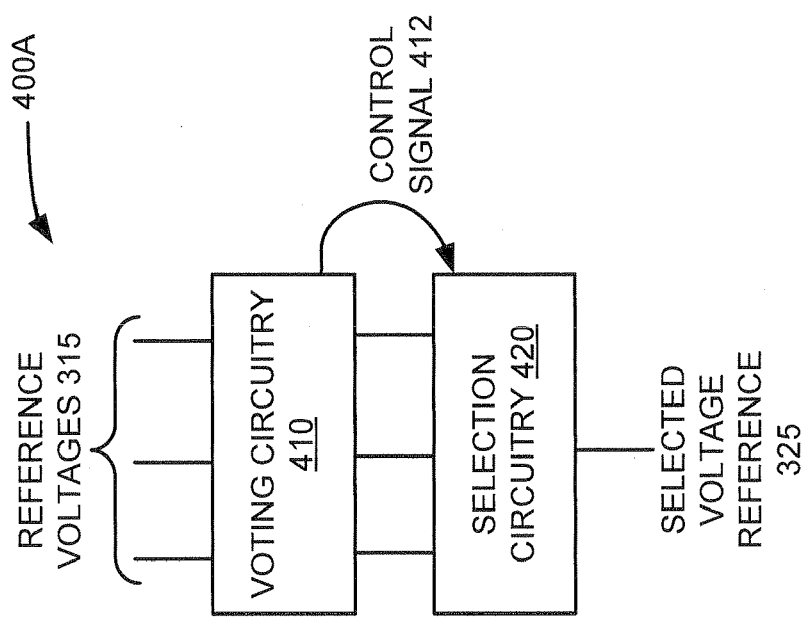

FIGS. 4A and 4B are block diagram examples of an output selection device 400 shown in FIG. 3. Referring to FIG. 4A, the output selection device 400A includes voting circuitry 410 to receive the reference voltages 315 from the floating gate reference devices 310-1 to 310-N. The voting circuitry 410 implements a particular voting scheme that determines which of the reference voltages 315 is most like others in the group of reference voltages 315. In some embodiments, the voting scheme can be performed by a comparator or other similar circuitry.

There are many voting schemes that the voting circuitry 410 can implement. For instance, the voting circuitry 410 can identify a reference voltage 315 that has a median value for its corresponding current, or a median value for the group of reference voltages 315. The voting circuitry 410 can identify when a majority of the reference voltages 315 have a common value and select one of the reference voltages 315 representing the majority. The voting circuitry 410 can be used to exclude certain reference voltages that have dropped below the rest of the reference voltages, indicating that the corresponding floating gate device 310 is leaking voltage from its floating gate more quickly than the others.

The voting circuitry 410 analyzes the reference voltages 315 from the floating gate devices 310-1 to 310-N, and according to the comparison, can send a control signal 412 to control the selection circuitry 420, such as a multiplexer, enabling the selection circuitry 420 to couple a selected floating gate device 310-1 to 310-N to the wake-up circuitry 330. The voting circuitry 410 can also pass the reference voltages to the selection circuitry 420, and the selection circuitry 420 can output at least one of the reference voltages 315 based on the control signal 412 from the voting circuitry 410.

Referring to FIG. 4B, the output selection device 400B includes characteristic selection circuitry 430 to receive the reference voltages 315 from the floating gate reference devices 310-1 to 310-N, and select at least one of the reference voltages 325 based on a characteristic of the reference voltages 315. For instance, since floating gate devices 310-1 to 310-N slowly over time lose a charge on a floating gate, causing their corresponding reference voltage 315 to drift lower, the characteristic selection circuitry 430 can select one of the floating gate devices 310-1 to 310-N to couple to the wake-up circuitry 330 with the greatest reference voltage. In some embodiments, the characteristic selection circuitry 430 can be performed by an OR gate or other similar circuitry that can couple a floating gate device 310 with the greatest output reference voltage to wake-up circuitry 330.

FIG. 5 is an example operational flowchart for the operation of the floating gate device shown in FIGS. 1, 2A, 2B, and 3. Referring to FIG. 5, in a block 510, the programmable system on a chip 100 is configured to provide a high level of voltage to a control gate of a floating gate device to set a floating gate voltage of the floating gate device. When the high level of voltage is provided to the control gate of the floating gate device, a floating gate is charged by electrons tunneled through an oxide layer separating the control gate with the floating gate, based on a phenomenon known as Fowler-Nordheim tunneling or hot carrier injection. This floating gate charging is time-dependent, meaning that floating gate voltage rises the longer the high voltage is applied to the control gate.

After the floating gate has reached the desired voltage level, the programmable system on a chip can transition to providing a ground voltage to the control gate, locking the voltage level on the floating gate. In some embodiments, the floating gate can be programmed with an amount of charge to control the desired resistance in the channel connecting the source and drain of a transistor. The floating gate can be charged until a particular resistance is reached, which determines an amount of current provided to wake-up circuitry.

In a block 520, the programmable system on a chip 100 is configured to generate a reference voltage with a floating gate device based on the floating gate voltage. The floating gate of the floating gate device has a set charge that activates the floating gate device to generate the reference voltage.

In a decision block 530, the programmable system on a chip 100 is configured to determine whether there another floating gate device to set. If there is another floating gate device to set, execution returns to block 510. Otherwise, execution proceeds to block 540, where the programmable system on a chip 100 is configured to select at least one of the reference voltages to power the wake-up circuitry based on the generated reference voltages. When there is only one floating gate device, the programmable system on a chip 100 can select the floating gate device. When there are multiple floating gate devices capable of generating reference voltages, the programmable system on a chip 100 can select at least one of the floating gate devices to power wake-up circuitry based on the reference voltages. As discussed above, this selection process may be based on the group of reference voltages, i.e., which one is the best representative of the group, or may be based on a particular characteristic of the reference voltage, i.e., which one has the highest voltage level.

In a block 550, the programmable system on a chip 100 is configured to power wake-up circuitry with the (selected) reference voltage while in a power saving mode. In some embodiments, this can include coupling the selected floating gate device to the wake-up circuitry, and allowing that floating gate device to act as a regulator for the wake-up circuitry.

One of skill in the art will recognize that the concepts taught herein can be tailored to a particular application in many other ways. In particular, those skilled in the art will recognize that the illustrated embodiments are but one of many alternative implementations that will become apparent upon reading this disclosure.

The preceding embodiments are examples. Although the specification may refer to "an", "one", "another", or "some" embodiment(s) in several locations, this does not necessarily mean that each such reference is to the same embodiment(s), or that the feature only applies to a single embodiment.

What is claimed is:

1. A system comprising:
    power saving circuitry to revive a system controller from a sleep mode for performance of operations in an active mode; and
    a regulator including a floating gate reference device to generate output voltage and current capable of powering the power saving circuitry during the sleep mode;
    a tunneling capacitor coupled with the floating gate reference device;
    a second capacitor coupled with the floating gate reference device, wherein a capacitance of the second capacitor is greater than a capacitance of the tunneling capacitor; and
    a switch coupled with the floating gate reference device, wherein the switch is capable of providing both a high voltage and a ground voltage to the tunneling capacitor coupled with the floating gate reference device.

2. The system of claim 1, wherein the floating gate reference device includes a floating gate that is configured to retain a floating gate voltage, and wherein the floating gate voltage is configured to activate a transistor to supply current to the power saving circuitry during the sleep mode.

3. The system of claim 2, wherein when the tunneling capacitor receives the high voltage, electrons tunnel through the tunneling capacitor to the floating gate, setting the floating gate voltage of the floating gate reference device.

4. The system of claim 2, wherein the transistor is an extended drain transistor device having an extended lightly doped drain region to reduce current leakage in the floating gate reference device, which allows the floating gate reference device the ability to retain a particular level of the floating gate voltage.

5. The system of claim 2, wherein the transistor includes a drain with an extended lightly doped region formed around the drain to increase an associated depletion region.

6. The system of claim 1, wherein the power saving circuitry is configured to maintain various states that the system controller held prior to entering the sleep mode, and during revival from the sleep mode, the power saving circuitry is configured to pass the states to the system controller.

7. The system of claim 1, wherein the power saving circuitry is configured to revive the system controller from the sleep mode responsive to at least one of an external indication to awake the system controller or a elapsed internal timer.

8. The system of claim 1, wherein the regulator further includes:
    one or more redundant floating gate reference devices to generate corresponding output voltages capable of powering the power saving circuitry during the sleep mode; and
    an output selection device to select at least one of the floating gate reference devices based on the output voltages, and to power the power saving circuitry during the sleep mode with the selected floating gate reference device.

9. The system of claim 8, wherein the output selection device further includes voting circuitry configured to compare a group of the output voltages received from the floating gate reference device and the one or more redundant floating gate reference devices, wherein the voting circuitry is configured to exclude floating gate reference devices having output voltages with voltage levels that deviate from the group of the output voltages, and wherein the voting circuitry is configured to select at least one of the floating gate reference devices having an output voltage that was not excluded based on the comparison.

10. The system of claim 8, wherein the output selection device is configured to select one of the floating gate reference devices having an output voltage with a greatest voltage level.

11. A system comprising:
multiple floating gate devices, each configured to generate a reference voltage according to a voltage retained on corresponding floating gates;
an output selection device to select at least one of the floating gate devices based on voltage levels of the reference voltages;
a plurality of tunneling capacitors each coupled with one of the multiple floating gate devices;
a second capacitor coupled with each of the multiple floating gate devices, wherein a capacitance of the second capacitor is greater than a capacitance of the tunneling capacitor; and
a switch coupled with each of the multiple floating gate devices, wherein the switch is capable of providing both a high voltage and a ground voltage to each of the tunneling capacitors coupled with the multiple floating gate devices.

12. The system of claim 11, wherein the multiple floating gate devices are located in a regulator, and wherein the output selection device is configured to couple the selected floating gate device to power saving circuitry, allowing the selected floating gate device to power the power saving circuitry during a sleep mode.

13. The system of claim 12, wherein voltages retained on corresponding floating gates of the multiple floating gate devices are configured to activate corresponding transistors of the multiple floating gate devices, generating reference currents capable of powering the power saving circuitry while in the sleep mode.

14. The system of claim 11, wherein the output selection device includes voting circuitry to compare a group of the reference voltages received from the floating gate devices, wherein the voting circuitry is configured to identify a majority of the reference voltages have an substantially common voltage level, and wherein the output selection device includes selection circuitry configured to select at least one floating gate devices having the reference voltage with the substantially common voltage level.

15. The system of claim 11, wherein the output selection device is configured to select one of the floating gate devices having a reference voltage with a greatest voltage level.

16. A method comprising:
programming a floating gate device using a tunneling capacitor coupled with the floating gate device and a second capacitor coupled with the floating gate device, wherein a capacitance of the second capacitor is greater than a capacitance of the tunneling capacitor;
operating a switch coupled with the floating gate device, wherein the switch is capable of providing both a high level of voltage and a ground voltage to the tunneling capacitor coupled with the floating gate device;
generating a reference voltage and current with the floating gate device; and
powering wake-up circuitry with the reference voltage and current while in a power saving mode, wherein the wake-up circuitry is configured to activate a main system controller from the power saving mode.

17. The method of claim 16, wherein the floating gate device includes a floating gate that is configured to retain a floating gate voltage, and wherein the floating gate voltage is configured to activate a transistor and generate the reference voltage and current.

18. The method of claim 17, further comprising:
providing a supply voltage to a drain region of the transistor;
providing the high level of voltage to the tunneling capacitor coupled with the floating gate device, which induces electron tunneling through the tunneling capacitor to the floating gate of the floating gate device, wherein the providing of the supply voltage to the transistor reduces charge injection from the floating gate through the transistor while the high level of voltage is provided to the tunneling capacitor; and
setting the floating gate voltage based on the electron tunneling of the floating gate device.

19. The method of claim 16 further comprises:
generating at least another reference voltage and current with at least another floating gate device; and
powering the wake-up circuitry with the floating gate device having the reference voltage with a greatest voltage level.

20. The method of claim 16 further comprises:
generating at least another reference voltage and current with at least another floating gate device;
comparing a group of the reference voltages generated by the floating gate devices to identify a reference voltage that has a median value for the corresponding current;
selecting at least one floating gate device having the reference voltage with the median value for the corresponding current based on the comparison; and
powering the wake-up circuitry with the selected floating gate device.

* * * * *